United States Patent
Miosga et al.

(10) Patent No.: US 11,119,166 B2
(45) Date of Patent: Sep. 14, 2021

(54) MAGNETIC RESONANCE SCANNER AND LOCAL COIL MATRIX FOR OPERATION AT LOW MAGNETIC FIELD STRENGTHS

(71) Applicant: Siemens Healthcare GmbH, Erlangen (DE)

(72) Inventors: Michael Miosga, Augsburg (DE); Robert Rehner, Neunkirchen am Brand (DE); Markus Vester, Nuremberg (DE)

(73) Assignee: Siemens Healthcare GmbH, Erlangen (DE)

( * ) Notice: Subject to any disclaimer, the term of this patent is extended or adjusted under 35 U.S.C. 154(b) by 2 days.

(21) Appl. No.: 16/476,671

(22) PCT Filed: Jan. 11, 2018

(86) PCT No.: PCT/EP2018/050662
§ 371 (c)(1),
(2) Date: Jul. 9, 2019

(87) PCT Pub. No.: WO2018/130614
PCT Pub. Date: Jul. 19, 2018

(65) Prior Publication Data
US 2019/0339344 A1 Nov. 7, 2019

(30) Foreign Application Priority Data
Jan. 13, 2017 (DE) ...................... 10 2017 200 511.4

(51) Int. Cl.
*G01R 33/36* (2006.01)
*G01R 33/3415* (2006.01)

(52) U.S. Cl.
CPC ..... *G01R 33/3628* (2013.01); *G01R 33/3415* (2013.01); *G01R 33/365* (2013.01); *G01R 33/3621* (2013.01)

(58) Field of Classification Search
CPC ........ G01R 33/34007; G01R 33/34046; G01R 33/34053; G01R 33/34069;
(Continued)

(56) References Cited

U.S. PATENT DOCUMENTS

| 4,333,053 A * | 6/1982 | Harrison | ............ G01R 33/3621 324/307 |
| 5,276,398 A * | 1/1994 | Withers | .................. G01R 33/34 324/318 |

(Continued)

FOREIGN PATENT DOCUMENTS

| CN | 102985839 A | 3/2013 |
| CN | 103026251 A | 4/2013 |

(Continued)

OTHER PUBLICATIONS

Doty, F. David, et al. "Radio frequency coil technology for small-animal MRI." NMR in Biomedicine: An International Journal Devoted to the Development and Application of Magnetic Resonance In vivo 20.3 (2007): 304-325.

(Continued)

*Primary Examiner* — Steven L Yeninas
(74) *Attorney, Agent, or Firm* — Lempia Summerfield Katz LLC

(57) ABSTRACT

The invention relates to a local coil matrix and to a magnetic resonance scanner for operation by means of a low magnetic field. The local coil matrix according to the invention has a first coil winding and a second coil winding and a first low-noise pre-amplifier and second pre-amplifier, each electrically connected to a coil winding. The first coil winding has a broadband matching in a first frequency range at a Larmor frequency to the first pre-amplifier connected thereto.

17 Claims, 3 Drawing Sheets

(58) Field of Classification Search
CPC ........ G01R 33/34076; G01R 33/34092; G01R 33/341; G01R 33/3415; G01R 33/3453; G01R 33/3614; G01R 33/3628; G01R 33/3621; G01R 33/3635; G01R 33/365; G01R 33/3657
See application file for complete search history.

(56) References Cited

U.S. PATENT DOCUMENTS

| | | | | |
|---|---|---|---|---|
| 5,424,645 | A * | 6/1995 | Doty | G01R 33/3635 324/318 |
| 2003/0122546 | A1* | 7/2003 | Leussler | G01R 33/341 324/318 |
| 2004/0124838 | A1* | 7/2004 | Duerk | G01R 33/3692 324/304 |
| 2009/0267606 | A1* | 10/2009 | Lazar | G01R 33/34076 324/318 |
| 2010/0225315 | A1* | 9/2010 | McDowell | G01R 33/34 324/307 |
| 2011/0037470 | A1* | 2/2011 | Driemel | G01R 33/36 324/318 |
| 2011/0074415 | A1 | 3/2011 | Chu | |
| 2012/0212224 | A1* | 8/2012 | Burns | G01R 33/3628 324/318 |
| 2012/0223709 | A1* | 9/2012 | Schillak | G01R 33/3621 324/309 |
| 2013/0063147 | A1 | 3/2013 | Findeklee | |
| 2013/0106416 | A1 | 5/2013 | Morich et al. | |
| 2013/0234706 | A1* | 9/2013 | Mandal | G01N 24/081 324/303 |
| 2013/0271143 | A1 | 10/2013 | Vester | |
| 2013/0285659 | A1* | 10/2013 | Sohn | G01R 33/3456 324/314 |
| 2014/0197832 | A1* | 7/2014 | Driesel | H01Q 7/04 324/307 |
| 2014/0228672 | A1 | 8/2014 | Duensing | |
| 2015/0015259 | A1* | 1/2015 | Duan | G01R 33/365 324/309 |
| 2015/0054506 | A1* | 2/2015 | Eberler | G01R 33/36 324/309 |
| 2016/0033592 | A1 | 2/2016 | Demir | |
| 2016/0069970 | A1* | 3/2016 | Rearick | G01R 33/3858 324/309 |
| 2016/0223629 | A1* | 8/2016 | Biber | G01R 33/3685 |
| 2016/0291191 | A1* | 10/2016 | Fukushima | G01R 33/3415 |
| 2017/0205481 | A1* | 7/2017 | Kim | G01R 33/3657 |
| 2018/0250527 | A1* | 9/2018 | Liney | G01R 33/4808 |

FOREIGN PATENT DOCUMENTS

| | | |
|---|---|---|
| CN | 103782185 A | 5/2014 |
| DE | 4218635 A1 | 12/1993 |
| DE | 102012206008 A1 | 10/2013 |

OTHER PUBLICATIONS

Fujita, Hiroyuki, et al. "RF surface receive array coils: the art of an LC circuit." Journal of magnetic resonance imaging 38.1 (2013): 12-25.

PCT International Search Report and Written Opinion of International Searching Authority dated Apr. 26, 2018, corresponding to PCT International Application No. PCT/EP2018/050662.

Chinese Office Action for Chinese Application No. 201880006771.8 dated Dec. 2, 2020, with English translation.

* cited by examiner

MAGNETIC RESONANCE SCANNER AND LOCAL COIL MATRIX FOR OPERATION AT LOW MAGNETIC FIELD STRENGTHS

CROSS REFERENCE TO RELATED APPLICATIONS

This present patent document is a § 371 nationalization of PCT Application Serial Number PCT/EP2018/050662, filed Jan. 11, 2018, designating the United States, which is hereby incorporated in its entirety by reference. This patent document also claims the benefit of DE 102017200511.4, filed on Jan. 13, 2017, which is also hereby incorporated in its entirety by reference.

FIELD

Embodiments relate to a local coil matrix and magnetic resonance tomography device for operation at low magnetic field strengths.

BACKGROUND

Magnetic resonance tomography devices are imaging apparatuses that, in order to map a subject under examination, align nuclear spins of the subject under examination with a strong external magnetic field, and use an alternating magnetic field to excite the nuclear spins to precess about this alignment. In response, the precession or return of the spins from the excited state into a low-energy state in turn produces an alternating magnetic field, also called the magnetic resonance signal, that is received by antennas.

Gradient magnetic fields are used to apply spatial encoding to the signals, so that the received signal may subsequently be associated with a volume element. The received signal is then analyzed, and a three-dimensional imaging representation of the subject under examination is provided. The generated representation indicates a spatial density distribution of the spins.

In magnetic resonance tomography devices, magnetic fields of 1.5 tesla, 3 tesla or greater may be used as the B0 field for aligning the nuclear spins. Since the Larmor frequency increases linearly with the B0 field strength, the Larmor frequency varies in ranges from 70 MHz up to 150 MHz and above. This includes the advantage that noise components decrease at a higher frequency. At the same time, however, the magnets needed become increasingly heavy and expensive because of the rising internal forces. In addition, the energies stored in the fields increase, so that increasingly expensive safety precautions must be taken for loss of superconductivity.

Therefore, for reasonably priced magnetic resonance tomography devices, there is an interest in reducing the necessary costs of the field magnets.

At lower B0 field strengths and the correspondingly lower Larmor frequencies of 30 MHz and below, the body of a patient absorbs less power from the alternating electromagnetic field from a transceiver coil. The quality factor of the coil increases, so that the amplitude of a receive signal increases as the Larmor frequency increases. The interaction between adjacent coils, for example in a local coil matrix, also increases. The stronger interactions cause shifts in resonant frequencies of the coils, resulting overall in degradation of the signal-to-noise ratio.

BRIEF SUMMARY AND DESCRIPTION

The scope of the present invention is defined solely by the appended claims and is not affected to any degree by the statements within this summary. The present embodiments may obviate one or more of the drawbacks or limitations in the related art.

Embodiments provide a local coil matrix and a magnetic resonance tomography device for low static magnetic field strengths with improved imaging.

The local coil matrix for a magnetic resonance tomography device including a low static magnetic field B0 includes a first coil winding and a second coil winding, and includes low-noise first preamplifier and second preamplifier, that are each electrically connected to one coil winding. The first coil winding includes broadband matching to the first preamplifier connected thereto in a first frequency range at a Larmor frequency. In an embodiment, the second coil winding also includes broadband matching.

The Larmor frequency is the frequency that equals a resonant frequency of the nuclear spins to be detected in a static magnetic field of low field strength, for example a field strength of less than or equal to 1.5 T, 1 T or 0.5 T.

Broadband matching is matching that for a deviation of a coil resonant frequency from the Larmor frequency by 100 kHz, 200 kHz or 500 kHz or by 1%, 5% or 10%, reduces the signal-to-noise ratio (SNR) at the preamplifier by less than 1 dB, 2 dB, 3 dB or 6 dB at the Larmor frequency.

The broadband matching may also be defined by the mismatch of the impedances of coil winding including matching network with respect to the input impedance of the preamplifier. Broadband matching is given if the magnitude of the impedance of the system including coil and matching network differs from the magnitude of the input impedance of the preamplifier at the Larmor frequency by more than 20%, 70%, 200% or 400%. For an input impedance of the preamplifier of 50 Ohms, the magnitude of the impedance of the system including the coil winding and matching network may equal, for example, more than 70 Ohms, 100 Ohms or 150 Ohms.

The broadband matching may also be defined by the reflection coefficient. For a local coil, the standing wave ratio (SWR) at the input of the preamplifier towards the system including coil winding and matching network is greater than 1.5, 2, 3 or 5 at the Larmor frequency. For an SWR of 2, for example, this corresponds to a signal voltage reflected at the input of the preamplifier equal to 33% of the signal voltage arriving from the antenna coil and matching network.

Given a plurality of adjacent coils, a local coil matrix including broadband matching provides improved reception with a better signal-to-noise ratio at the Larmor frequency because of the shifted resonant frequencies caused by the interaction between the coils.

In an embodiment of the local coil matrix, the first coil winding is arranged adjacent to the second coil winding. The first and second coil windings respectively form a first resonant circuit and a second resonant circuit, that form a coupled system including a first coil winding and second coil winding, which system includes a first resonant frequency and a second resonant frequency. The coupling is achieved, for example, by the magnetic field of the first coil winding overlapping the second coil winding, and vice versa. The coil windings form resonant circuits as a result of the inherent capacitance and connected components. The first resonant frequency and the second resonant frequency of the coupled system are different and lie in the first frequency range of the broadband matching. For example, the first frequency range of the broadband matching may lie at 100 kHz, 500 kHz, 1 MHz or 2 MHz about the Larmor frequency.

By both resonant frequencies lying in the range of the broadband matching, it is possible to reduce the cost of suppressing any coupling without losing too much signal-to-noise ratio as a result of mismatch.

In an embodiment of the local coil matrix, the first coil winding includes a plurality of turns. The second coil winding may also include a plurality of turns.

A coil including a plurality of turns includes a higher impedance, so that a matching network to a subsequent preamplifier including a higher input impedance may have a simpler and lower-loss design or may even be omitted completely, that may be advantageous for example, in conjunction with the low-noise transistors discussed below.

In an embodiment of the local coil matrix, the first coil winding includes a direct signal connection without matching network to the first preamplifier. The second coil winding may also include a direct signal connection without matching network to the second preamplifier.

As mentioned above, it may be advantageous when using low-noise transistors, also in conjunction with coils including a plurality of turns, to connect the preamplifier directly to the coil winding without a matching network, that performs an impedance transformation and/or is lossy. An impedance transformation may be, for example, a factor of more than 2 or less than 0.5 between input impedance and output impedance of the system of switching elements between coil and preamplifier. A connection may be provided by a low-resistance conductor (<1 Ohm) of length less than a tenth of the wavelength of a signal at the Larmor frequency on the conductor. When the resonant frequency of the coil winding is detuned, for example by interaction with the second coil winding in the event of a modified geometry, the noise current of the preamplifier produces a noise voltage across the impedance of the coil winding that is smaller in comparison with ideal matching. Ideal matching refers to when the impedance of the coil winding, which impedance is optionally transformed by the matching network, equals the input impedance of the preamplifier.

In an embodiment of the local coil matrix, the local coil matrix includes a matching network that includes a signal connection to the first coil winding and to the first preamplifier. The matching network is a circuit of electrical components that perform between signal input and signal output, an impedance transformation for a signal at the Larmor frequency. An impedance transformation may be, for example, a factor of more than 2 or less than 0.5 between input impedance and output impedance of the system of the switching elements between coil and preamplifier. The impedance of the system including a matching network and first coil winding is smaller than an input impedance of the first preamplifier. For example, the magnitude of the impedance may be smaller by the factor 2, 5, 10, 20, 50, 100 or more.

The matching network provides for a change to the source impedance presented to the preamplifier by coil winding and matching network. By the impedance of the system including a coil winding and matching network being smaller than the input impedance of the preamplifier, a noise current of the preamplifier produces a smaller increase in noise in the event of detuning of the first coil winding. A local coil matrix may be made insensitive to detuning of the resonant frequencies by the patient or as a result of geometry changes.

In an embodiment of the local coil matrix, the matching network is configured such that an increase in the noise in the signal, which increase is produced by a noise current of the first preamplifier across the impedance of the system including a matching network and first coil winding in the event of detuning of the first coil winding, is smaller than a predetermined limit value.

For example, the detuning may equal more than 0.1%, 1%, 2%, 5% or 10% of the resonant frequency, e.g. of the Larmor frequency of the magnetic resonance tomography device. In the event of detuning, there is an increase, inter alia, in the noise voltage produced by the noise current of the preamplifier across the impedance of the system including a matching network and coil winding. The predetermined limit value may be, for example, an increase in the noise of 1 dB, 3 dB, 6 dB or 12 dB with respect to the noise signal at the resonant frequency.

In an embodiment of the local coil matrix, the preamplifier includes an E-PHEMT (Enhancement mode Pseudomorphic High Electron Mobility Transistor).

The E-PHEMT is a type of transistor that includes a low inherent noise. The low inherent noise provides that a deterioration in the signal-to-noise ratio (SNR) without detuning of the coil winding by the broadband matching may be traded for a reduced rise in the noise with detuning of the coil winding without causing a reduction in the image quality compared with preamplifiers containing conventional transistors in the ideal case without detuning. This simplifies the handling and configuration of the local coils and results in more reproducible image quality.

Low noise may also be achieved by cooling the preamplifier as an alternative to, or in conjunction with, low-noise transistor types.

In an embodiment of the local coil matrix, the local coil matrix includes a first matching network, that may be adjusted via a control connection and includes a signal connection to the first coil winding. The local coil matrix also may include a second matching network, that may be adjusted via a control connection and includes a signal connection to the second coil winding, with the first matching network and the second matching network being independent of one another.

An adjustable matching network makes it possible to adapt the reception properties of the local coil matrix to different conditions, for example different distances from the body of the patient or a different physiognomy.

In an embodiment of the local coil matrix, the adjustable first matching network is configured to change the first resonant frequency of the first coil winding and/or the broadband matching of the first preamplifier. For example, a voltage-variable capacitance such as a PIN diode may be provided in the matching network. The same may apply to the second matching network and the second preamplifier.

An adjustable resonant frequency and/or broadband matching makes it possible to optimize the sensitivity of the local coil matrix to a Larmor frequency defined by the magnetic field.

In an embodiment of the local coil matrix, the matching network is configured to select a predetermined resonant mode in the signals from the first coil winding and from the second coil winding, as a function of an adjustment via the control connection. For example, specific modes may be favored by suitable adjustment of variable capacitances. The individual modes differ in terms of the resonant frequency and therefore, for example, the matching network may influence the resonant frequency of a mode and bring the resonant frequency into agreement with the Larmor frequency. The mode makes a larger contribution to the receive signal of the local coil matrix. In this context, being favored in the signal may be, for example, when an amplitude of the specific mode in the signal is raised by at least 1 dB, 3 dB, 6 dB or 12 dB with respect to amplitudes of other modes.

By selecting specific modes, it is possible, for example, to acquire specific regions under examination at different depths with a better signal quality by favoring modes including maximum sensitivity in this region.

In an embodiment of the local coil matrix, the first coil winding and a second coil winding include a common coil-conductor segment and a decoupling element. For example, the coil windings may be embodied in the form of an "8". A capacitance may then be inserted as the decoupling element in a common conductor piece, that is arranged in the center of the "8". In this case, the matching network may be adjusted to favor, from the signals from the first coil winding and from the second coil winding, a resonant mode in which a current through the decoupling element is reduced.

By suitable adjustment of variable capacitances in the matching network, it is hence possible, for example, to select a resonant mode of the first and second coil windings for which the decoupling element includes a minimum effect, for example as a result of ohmic or dielectric losses, on the signal to be analyzed.

In an embodiment of the local coil matrix, the first coil winding includes a first conducting segment and a second conducting segment, that are electrically isolated from one another. For example, the first coil segment and the second coil segment may be arranged as a conductor track on two opposite surfaces of a substrate. The first conducting segment and the second conducting segment each include a region, that, when projected perpendicular to the surfaces, overlap one another and are isolated from one another. The two overlapping regions of the conductor segments form with the intervening substrate or another low-loss dielectric therebetween a capacitance between the two conductor segments.

The overlapping conductor regions form with the dielectric a low-loss capacitance, that facilitates a high-quality coil winding.

In an embodiment of the local coil matrix, the local coil matrix includes a signal line for connecting to a magnetic resonance tomography device including an ohmic sheath current filter.

At a lower magnetic field strength and a resultant lower Larmor frequency, there is lower coupling of an excitation pulse from the magnetic resonance tomography device into a signal line given a constant length. It is hence possible to provide an ohmic sheath current filter, that also does not require precise tuning to a specific frequency.

In an embodiment of the local coil matrix, the local coil matrix includes a signal line for connecting to a magnetic resonance tomography device including a symmetrical twin-conductor lead. The local coil may be configured to transmit a resonant signal of the nuclear spins via each conductor of the twin-conductor lead. A symmetrical twin-conductor lead is considered to be a pair of conductors that are fed through a dielectric at a predetermined separation and isolated from one another. The two conductors may be surrounded by a common conducting shield. Examples of such twin-conductor leads are CAT cables in LAN cabling, that include conductor pairs twisted in pairs and a common shield.

A lower Larmor frequency and also an associated lower coupling-in from the excitation pulses, provides for the use of low-cost symmetrical twin-conductor leads for transmitting radiofrequency signals between local coil matrix and magnetic resonance tomography device.

In an embodiment of the local coil matrix, the local coil matrix includes a signal line for connecting to a magnetic resonance tomography device. A plug-in connector including a plurality of signal contacts is provided on the signal line. In the plug-in connector, a plurality of ground contacts surround a plurality of signal contacts. In other words, in two, three or more different directions in a plane that is substantially perpendicular to a direction in which the plug-in connector is joined to a corresponding mating piece in order to make contact, the closest neighbors to a signal contact are ground contacts. A ground contact may be arranged between each signal contact and a neighboring signal contact.

The arrangement of signal contacts surrounded by ground contacts forms a coaxial connection, that at the low frequencies below 30 MHz of a magnetic resonance tomography device, economically replaces costly coaxial plugs.

In an embodiment of the magnetic resonance tomography device, the machine includes a magnetic field camera including an yttrium iron garnet (YIG) sample. A YIG sample includes an electron spin resonance that, for example at a low B0 magnetic field strength of the magnetic resonance tomography device, lies in the range of 20 to 30 GHz, and may be received by commercially available technology.

As a result of the higher frequency compared with conventional magnetic resonance tomography devices using field cameras based on nuclear spin resonance, the signal-to-noise ratio of a field camera using YIG is better and is easier to analyze, whereas using a YIG sample in conventional magnetic resonance tomography devices including B0 fields of 1.5 T, 3 T or more is no longer possible using commercially available devices owing to the overly high electron spin resonance frequency.

The method includes the features of the local coil matrix and of the magnetic resonance tomography device.

DETAILED DESCRIPTION

Figure 1:
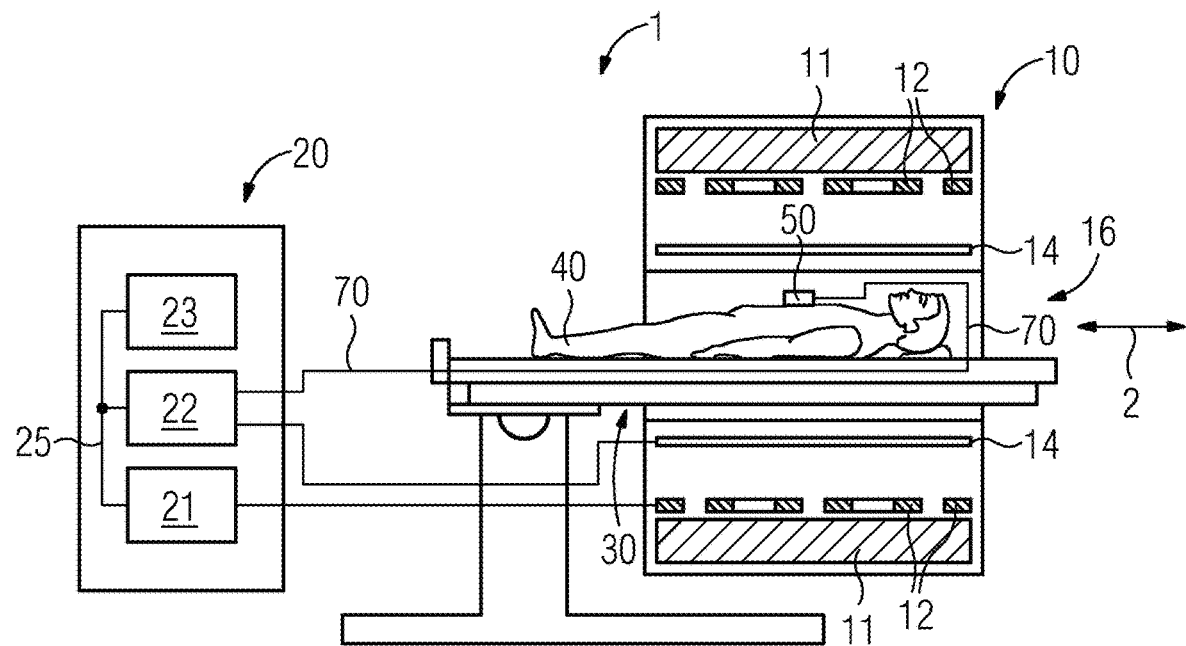
FIG. 1 depicts a magnetic resonance tomography device according to an embodiment.

FIG. 1 depicts a schematic representation of an embodiment of a magnetic resonance tomography device 1.

The magnet unit 10 includes a field magnet 11, that produces a static magnetic field B0 for aligning nuclear spins of samples or in a body of a patient 40 in an acquisition region. The acquisition region is arranged in a patient tunnel 16, that extends through the magnet unit 10 in a longitudinal direction 2. In an embodiment of the magnetic resonance tomography device 1, the field magnet 11 is a superconducting magnet, that may provide magnetic fields including a magnetic flux density of 1 T or less. The relatively low field strength reduces the size and material costs of the field magnets including the ongoing operating costs. Permanent magnets or electromagnets including normal-conducting coils may also be used.

The magnet unit 10 also includes gradient coils 12, that are configured to superimpose variable magnetic fields in three spatial dimensions on the magnetic field B0 for the purpose of spatial discrimination of the acquired imaging regions in the examination volume. The gradient coils 12 may be coils made of normal-conducting wires, that may generate mutually orthogonal fields in the examination volume.

The magnet unit 10 also includes a body coil 14, that is configured to radiate into the examination volume a radiofrequency signal supplied via a signal line, and to receive resonance signals emitted by the patient 40 and to output the resonance signals via a signal line. The magnetic resonance tomography device also includes one or more local coil matrixes 50, that are arranged in the patient tunnel 16 close to the patient 40.

A control unit 20 supplies the magnet unit 10 with the various signals for the gradient coils 12 and the body coil 14, and analyses the received signals.

The control unit 20 includes a gradient controller 21, that is configured to supply the gradient coils 12 via supply lines with variable currents that provide, coordinated in time, the desired gradient fields in the examination volume.

In addition, the control unit 20 includes a radiofrequency unit 22, that is configured to produce a radiofrequency pulse including a defined variation over time, amplitude and spectral power distribution for the purpose of exciting magnetic resonance of the nuclear spins in the patient 40. Pulse powers may reach in the region of kilowatts here. The radiofrequency unit 22 includes for this purpose a radiofrequency generator, that may be implemented as a frequency synthesizer, for example, that is controlled by numerical values. The individual units are interconnected via a signal bus 25.

The radiofrequency signal produced by the radiofrequency unit 22 is fed via a signal connection to the body coil 14, and radiated into the patient tunnel 16. It is also possible, however, to emit the radiofrequency signal via a local coil, that is arranged on the patient, possibly also via the local coil matrix 50.

The local coil matrix 50 receives a magnetic resonance signal from the body of the patient 40, because, as a result of the small distance, the signal-to-noise ratio (SNR) of the local coil matrix 50 is better than when using the body coil 14 for reception. The MR signal received by the local coil matrix 50 is conditioned in the local coil matrix 50 and passed to the radiofrequency unit 22 of the magnetic resonance tomography device 1 for analysis and image acquisition. The signal connection 70 is also used, although separate signal connections or wireless transmission are also possible. Dedicated local coil matrixes 50 or other antennas may be provided for the reception.

Figure 2:
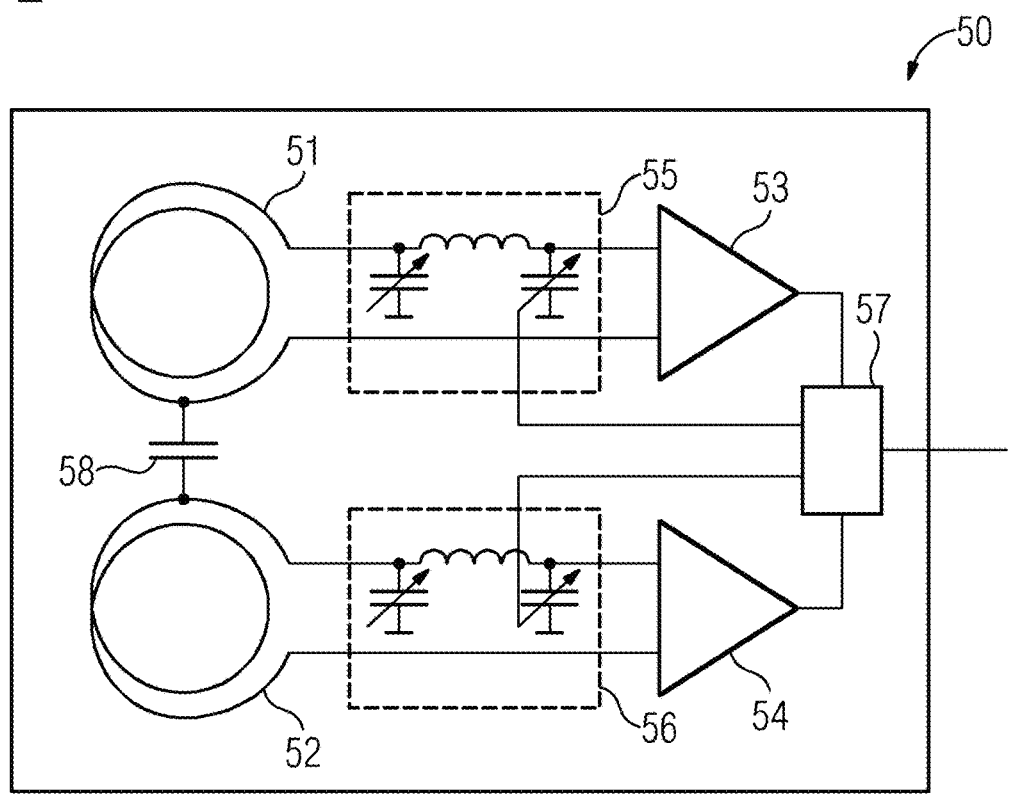
FIG. 2 depicts a local coil matrix according to an embodiment.

FIG. 2 depicts a schematic representation of an embodiment of a local coil matrix 50. The local coil matrix 50 includes a first coil winding 51 and a second coil winding 52. Connected to the coil windings 51, 52 are respectively a first preamplifier 53 and a second preamplifier 53, each of which amplifies the magnetic resonance signals received by the coil windings 51, 52. The first and second preamplifiers 51, 52 are low-noise preamplifiers, also known as low noise amplifiers (LNA). Normally, the first coil winding 51 and the second coil winding 52 are resonantly tuned to the frequency of the magnetic resonance signal, the Larmor frequency. This maximizes the signal amplitude. In addition, the first preamplifier 53 and the second preamplifier 54 are matched to the impedance of the coil windings 51, 52 in order to achieve an optimum signal-to-noise ratio and not to lose a portion of the signal through reflection.

In the case of relatively low static magnetic fields B0, as is the case for the local coil matrix 50, for example at values of 1 T or less, the Larmor frequency is also smaller, in proportion to the static magnetic field B0. As the Larmor frequency decreases, however, the absorption for alternating electromagnetic fields at this frequency in human body tissue also decreases to an even greater extent. During use on the patient, the resonant circuits formed by the first coil winding 51 and the second coil winding 52 exhibit far lower attenuation at the Larmor frequency than in magnetic resonance tomography devices using 1.5 T or 3 T. As a result of overlapping alternating magnetic fields, the coil windings 51, 52 interact with one another, resulting in coupling of the coil resonances, that increases with decreasing attenuation by the body tissue at lower frequencies. As a consequence of the coupling of the coil windings 51, 52, the coupled system exhibits splitting of the resonant frequencies $\omega 0$ into two different values $\omega 1$ and $\omega 2$. The first preamplifier 53 and the second preamplifier 54 of the local coil matrix 50 are therefore no longer optimized in terms of their matching to the Larmor frequency, but to an increased sensitivity at the frequencies $\omega 1$ and $\omega 2$ while including reduced sensitivity at precisely the Larmor frequency. Typically, given narrowband matching, the sensitivity, or the signal-to-noise ratio, for magnetic resonance signals at the Larmor frequency is then sharply reduced, for example by 6 or 12 dB.

In contrast, the local coil matrix 50 includes broadband matching. A deviation of the first and/or second resonant frequency from the Larmor frequency by 100 kHz, 200 kHz or 500 kHz results in this case only in a reduction in the signal-to-noise ratio (SNR) at the Larmor frequency at the preamplifier of less than 1 dB, 2 dB or 3 dB. A performance of this type may be achieved, for example, by a deliberate mismatch which may be referred to as broadband matching of the preamplifier.

In addition, the broadband matching may be verified, for example, by measuring the standing wave ratio (SWR), that may be determined by directional couplers by measuring the incoming and the reflected radiofrequency power at the input to the preamplifier. In this case, the standing wave ratio deviates significantly from the ideal value of 1, and, for example, is greater than 1.5, 2, 3 or 5. The standing wave ratio may also be calculated from the complex impedances of the preamplifier on one side and of the system on the other side including a coil winding and matching network. The broadband matching corresponds to differences in the magnitude of the impedance of the system including a coil winding and matching network from the magnitude of the input impedance of the preamplifier by more than 20%, 70%, 200% or 300%.

FIG. 2 depicts matching networks 55, 56 for a preamplifier 53, 54 of an embodiment of the local coil matrix 50. A first matching network 55 is arranged between the first coil winding 51 and the first preamplifier 53. The first matching network 55 is depicted as a variable PI filter, although other circuits for matching may be used, for example series or resonant circuits. In the embodiment of FIG. 2, one or both capacitances of the PI filter are adjustable. A local-coil controller 57 performs tuning in order to be able to adapt the tuning of the local coil to different arrangements, for example, on a patient. This may be done, for example, by different control voltages across PIN diodes as the capacitances.

Other circuits, however, may be used as the matching network. For example, it is also possible to use parallel and/or series capacitances to change the matching. The capacitances may be configured as adjustable capacitances. More complex circuits would also be possible, however, for example circuits such as auxiliary resonant circuits, that are coupled to the resonant circuit formed by the coil winding.

In a method, the controller 20 of the magnetic resonance tomography device 1 adjusts the adjustable matching network 55, 56 to achieve broadband matching of the coil winding 51, 52 to the preamplifier 53, 54. The received signal may be optimized by varying the adjustment of the matching network 55, 56. Additional sensors, for example for measuring the impedance, the standing wave ratio or even the geometry of the arrangement, may be used to achieve a predetermined broadband matching. It is also possible for the controller to use stored adjustment settings, for example, in order to adjust the resonant modes described below.

An adjustable matching network 55, 56 also includes an impact on the resonant modes of the coil windings 51, 52. For example, in an embodiment, the local-coil controller 57 and/or the controller 20 are configured to make adjustments to the matching network(s) 55, 56 so as to favor a resonant mode of the two coil windings including a predetermined spatial distribution by the matching network changing the resonant frequency of a mode. The individual modes differ in terms of their resonant frequency, with the result that a mode whose resonant frequency is brought into agreement with the Larmor frequency, makes a strong contribution to the magnetic resonance signal. It is thereby possible, for example, to switch the detection region of the local coil matrix 50 between a mode that is sensitive at the surface and a mode that is sensitive at depth.

In one embodiment, the coil windings 51, 52 are connected electrically to one another by decoupling elements 58. The decoupling elements are also electrically lossy, however, that reduces the sensitivity of the local coil matrix 50. In an embodiment of the local coil matrix, the local-coil controller 57 and/or the controller 20 are configured, by suitable selection of the favored resonant mode, to reduce a current flow through the decoupling element and therefore also to reduce the loss and improve the quality.

Figure 3:
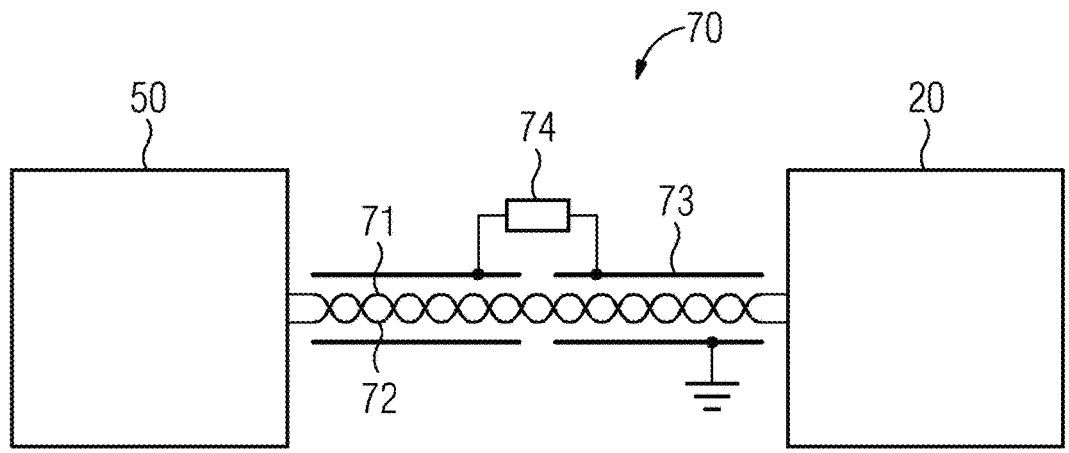
FIG. 3 depicts a signal connection of a local coil according to an embodiment.

FIG. 3 depicts schematically an embodiment of a signal connection 70 of a local coil 50 to a controller 20 of a magnetic resonance tomography device 1.

The signal line 70 includes a first conductor 71 and a second conductor 72, that are embodied as symmetrical conductors. The two conductors 71, 72 are guided at a predetermined distance from one another and isolated from one another by a dielectric. The two conductors 71, 72 may be surrounded by a common conducting shield 73. Such signal lines 70 including symmetrical conductors 71, 72 are available at low cost, for example, as CAT cables in LAN cabling. In this context, the first conductor 71 and the second conductor 72 are normally used as a symmetrical conductor pair in order to transmit a symmetrical signal. The present signal line 70, the local coil matrix 50 and the controller 20, however, may be configured to use the two conductors 71 and 72 as separate signal conductors for different asymmetrical signals including a reference ground at the shield. By selecting a suitable length for the signal line 70 and suitable transmit-side and receive-side line terminations, the asymmetrical signals may be sufficiently decoupled to avoid the need for any cost-intensive coaxial cables. An embodiment employs signal transmission via coaxial conductors or optical guides or even wireless transmission technology.

In the case of lower static magnetic fields B0 and associated lower Larmor frequencies, there is also reduced development of standing waves on a shield of the signal line by virtue of the longer wavelength relative to the line length. For the signal line 70 instead of costly resonant sheath current filters, ohmic sheath current filters may be used as indicated by the gap in the shield 73 and the bridging resistor 74.

Low-cost multiway plugs and/or sockets, that include a matrix including a contact pins or connecting pins in a two-dimensional array, may be used as plug-in connectors between the signal line 70 and the controller 20. The first conductor 71 and the second conductor 72, and the shield 73, are connected to the contacts of the plug and/or socket such that a contact connected to the first conductor 71 is surrounded by contacts that are ohmically connected to the shield. The same applies to the second conductor 72. The contact connected to the first conductor 71 is not arranged immediately adjacent to a contact that is ohmically connected to the second conductor 72. Between the contacts, however, may be arranged at least one additional contact that is ohmically connected to the shield 73.

The shield 73 is also continued across a plug-in connection, and any interaction between signal conductors is reduced without using expensive coaxial plugs that are costly to assemble.

In an embodiment of the coil windings 51, 52, one or both are made of high-temperature superconductors to improve the reception quality. Examples of materials may include high-temperature superconductors or carbon nanotubes, more specifically graphene.

In an embodiment of the local coil matrix 50, the first coil winding 51 and/or the second coil winding 52 are arranged as conductor tracks on a planar dielectric, for example a rigid or flexible printed circuit board. The dielectric includes two opposite surfaces, on each of which is arranged a conductor track. Each single coil winding 71, 72 is formed by two opposite conductor tracks, that in each case are electrically connected to one another through the dielectric at one or more points by interconnections referred to as vias. The surface area of the conductor tracks as regards the radiofrequency line is thereby increased to reduce skin-effect implications and to improve the quality of the coil winding. By virtue of the lower Larmor frequency at the lower static magnetic field, the dielectric losses are sufficiently low even with conventional printed circuit board material as the dielectric.

In an embodiment of the local coil matrix 50, a coil winding 51 includes a plurality of coil segments that are ohmically isolated from one another, with at least two of the segments being arranged on opposite surfaces of the dielectric. The two segments overlap, i.e. a projection of a segment onto the opposite surface of the dielectric, which projection is perpendicular to the surface, intersects the second segment of the coil winding. The overlapping segments together with the intervening dielectric form a capacitance, that is connected in series with the inductance of the antenna coil.

For the purpose of calibrating and homogenizing the magnetic fields, magnetic field cameras are used, in which the strength of the magnetic field is determined for a sample by determining the spin resonance frequency. Magnetic field cameras may be implemented using samples made of an yttrium iron garnet compound (YIG), that exhibits high quality in the microwave region and a narrow band of electron spin resonance. The electron spin resonance for magnetic fields of 1.5 T or above, however, lies in the region of several 10 GHz and may only be analyzed at great expense. For the magnetic resonance tomography device including a static magnetic field B0 of 1 T or less, however, the electron spin resonance is in a frequency range for which analysis circuits are available technically and commercially. The magnetic resonance tomography device therefore includes, in one embodiment, one or more magnetic field cameras with a YIG sample.

The controller 20 of the magnetic resonance tomography device 1 is configured to determine the magnetic field at a position in the patient tunnel 16 using the magnetic field camera, to compare the magnetic field with a predetermined setpoint value, and to bring the magnetic field to the setpoint value by shimming. Shimming may be achieved, for example, by adjustable currents in correction coils, that generate an additional, superimposed magnetic field.

Figure 4:
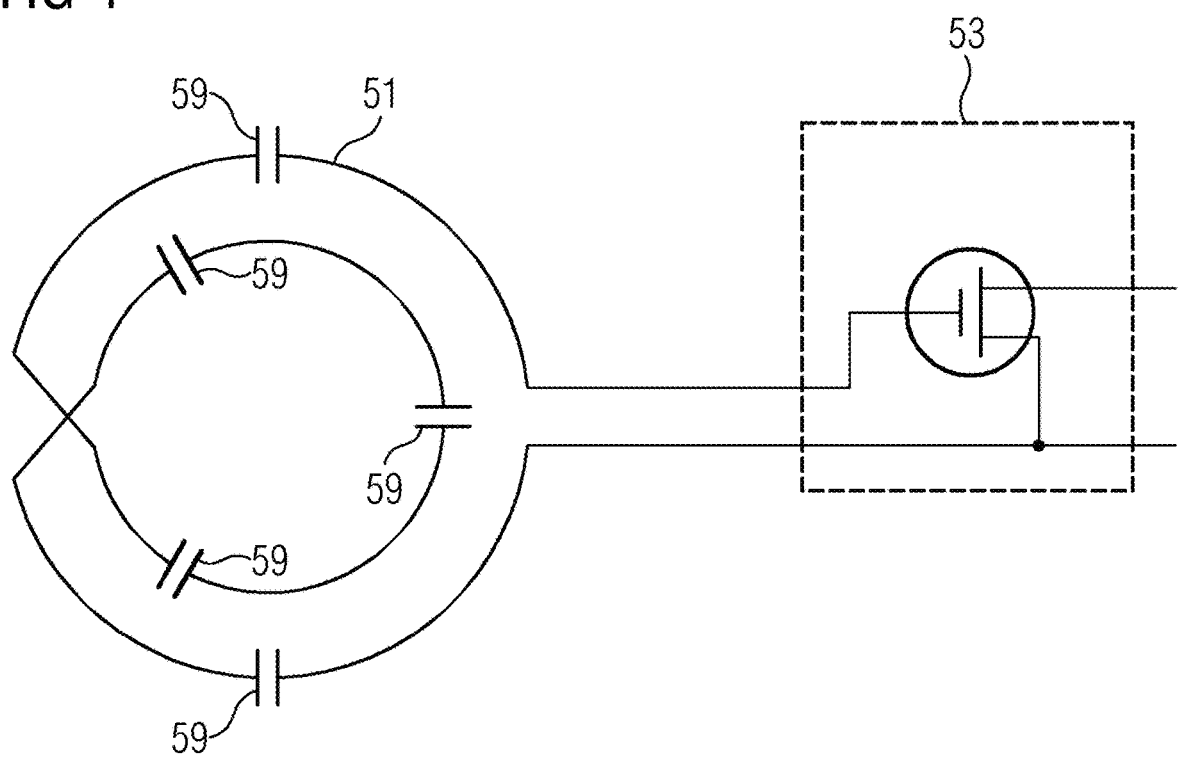
FIG. 4 depicts a schematic representation of a coil and a preamplifier of a local coil matrix according to an embodiment.

FIG. 4 depicts an embodiment of a first coil winding 51 and a first preamplifier 53. For the sake of clarity, FIG. 4 does not show all the elements, for example elements such as a power supply or series resistors. Nor does it show circuitry for detuning during an excitation pulse of the magnetic resonance tomography device 1.

The first coil winding 51 in FIG. 4 includes a plurality of turns, with two turns being depicted by way of example. Extension capacitances 59 are provided in the first coil winding, by which, the first coil winding 51 may be made to resonate at the Larmor frequency even given small dimensions of a few centimeters. The impedance of the first coil winding 51 may be increased by the plurality of coil turns. The impedances are of order of magnitude of several Ohms up to two-digit values for coils including a plurality of turns. In contrast, the input impedance of typical preamplifiers with low noise FET transistors such as E-PHEMT, for example, vary in the region of several kOhms.

Figure 5:
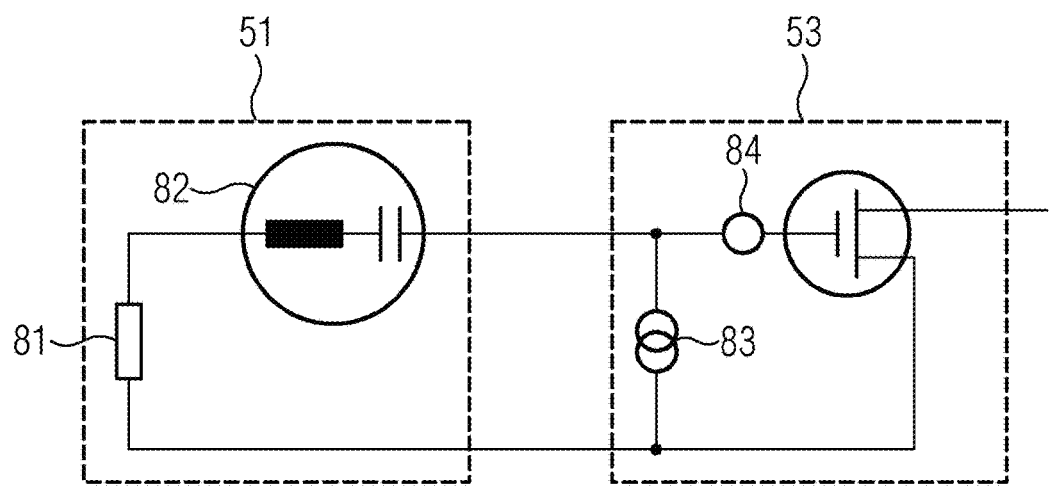
FIG. 5 depicts schematically an equivalent circuit for FIG. 4 for estimating the noise performance according to an embodiment.

FIG. 5 depicts an equivalent circuit of the circuit of FIG. 4 for estimating the noise produced by the circuit. The first coil winding 51 is represented by a real component of the impedance, indicated by an ohmic coil resistance 81, and an imaginary component of the impedance, depicted by the complex component 83 of the coil impedance.

The first preamplifier 53 is represented in the noise analysis by a noise voltage source 83 and a noise current source 84. The noise current source 84 generates a real and interfering noise voltage across the ohmic coil resistance 81. The imaginary noise voltage generated across the complex component 82 by the noise current does not contribute to an interfering noise power.

The aim is to use a first matching network 55 to transform the output impedance of the first coil winding 51 at resonance, i.e. at the Larmor frequency, to the same value as the input impedance of the first preamplifier 53. An optimum signal-to-noise ratio may hence be achieved for the first coil winding 51, that is resonant at the Larmor frequency.

For a local coil matrix 50, the ideal state is the exception, however, for example, in the case of local coil matrixes of variable geometry. The interaction with the patient 40 and with adjacent coil windings as the position varies detunes the first coil winding. The detuning causes a phase shift, and the complex component 82 of the coil impedance generates from the noise current from the noise current source 84 a real noise voltage, that degrades the signal-to-noise ratio. The component is transformed by the impedance transformation of the first matching network 53 to higher voltage values and hence contributes disproportionately to the noise.

Hence for the local coil matrix 50, broadband matching is performed that departs from the ideal matching of coil impedance to input impedance of the first preamplifier 53. The embodiment shown in FIG. 4 dispenses with a matching network 53 including impedance transformation. The first coil winding 51 may include only a single turn. The low signal voltage from the first coil winding 51 requires that the first preamplifier 53 includes a very high gain and that the first preamplifier 53 includes an extremely low noise figure, that may be achieved, for example, by using an E-PHEMT as the transistor and/or by cooling the amplifier.

A compromise that includes a better SNR at resonance and yet still includes a good performance when detuned may be achieved by increasing in the broadband matching the output impedance of the first coil winding 51 while still keeping the output impedance significantly, i.e. by factors or orders of magnitude, lower than the input impedance of the first preamplifier 53. A plurality of coil turns may be used for the first coil winding 51. For example, a second coil turn increases the impedance of the first coil winding 51 by a factor of 4.

Figure 6:
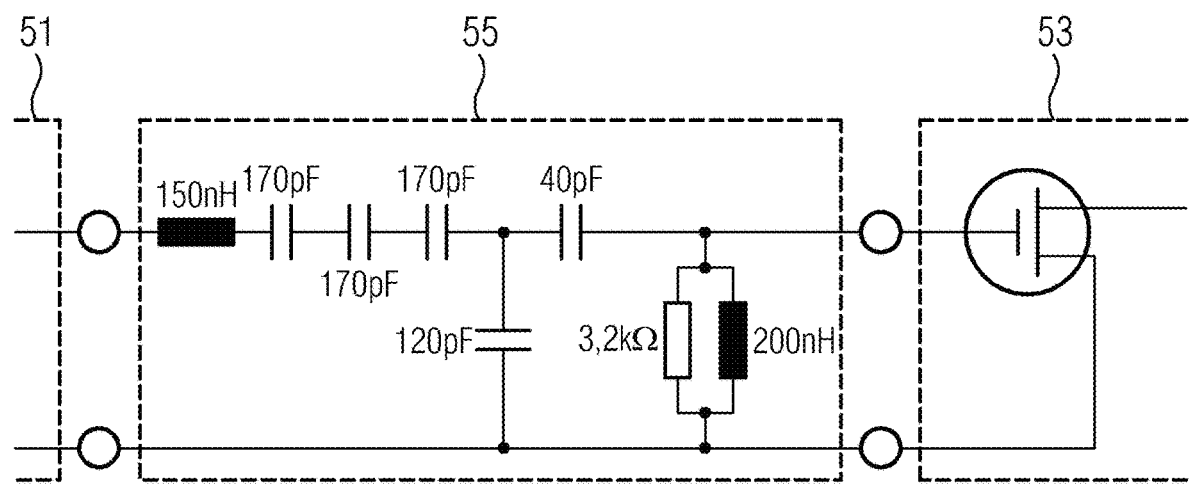
FIG. 6 depicts a schematic representation of a matching network of a local coil matrix.

FIG. 6 depicts another embodiment. The local coil matrix 50 is provided with a matching network 55, 56 that does not aim for an optimum match between antenna impedance and preamplifier input impedance at resonance, but only transforms or raises the antenna output impedance towards the preamplifier input impedance. The optimum ratio T (for transformation) of the magnitudes of preamplifier input impedance divided by transformed antenna output impedance depends on the noise figure of the first preamplifier 53. The lower the figure, the higher the gain by the first preamplifier 53 may be without significantly degrading the SNR at resonance. The ratio T may also be larger, and the preamplifier noise in the case of detuning may be reduced. Example values for T may be greater than 1000, 500, 200, 100 or 50.

The matching network 55 depicted in FIG. 6 is calculated for a frequency of 64 MHz, and transforms an impedance of the first coil winding 51 of 0.8 Ohms into an output-side impedance value of 12 Ohms with respect to the first preamplifier 53. In this regard, the matching network is comparable with the impedance of a coil winding including a plurality of turns (e.g. 4). Variants in which capacitances replace inductances may be used, for example the choke between gate and ground of the preamplifier. Phase shifts may arise in this case, however.

The observations made with regard to FIGS. 4, 5 and 6 apply equivalently to the second coil winding 52, the second preamplifier 54 and the second matching network, and also to additional coil windings and preamplifiers of the local coil matrix.

It is to be understood that the elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding or following claim, whether independent or dependent, and that such new combinations are to be understood as forming a part of the present specification.

While the present invention has been described above by reference to various embodiments, it may be understood that many changes and modifications may be made to the described embodiments. It is therefore intended that the foregoing description be regarded as illustrative rather than limiting, and that it be understood that all equivalents and/or combinations of embodiments are intended to be included in this description.

The invention claimed is:

1. A local coil matrix for a magnetic resonance tomography device including a low static magnetic field, the local coil matrix comprising:
   a first coil winding;
   a second coil winding;
   a low-noise first preamplifier;
   a second preamplifier; and
   a matching network configured to be adjusted via a control connection, the matching network comprising a signal connection to the first coil winding, to the second coil winding, or to the first coil winding and the second coil winding, the matching network further configured to select a predetermined resonant mode from a plurality of resonant modes as a function of an adjustment via the control connection in order to switch a detection region of the local coil matrix between a mode that is sensitive at a surface and a mode that is sensitive at a specified depth;
   wherein the first preamplifier is electrically connected to the first coil winding, the second preamplifier is electrically connected to the second coil winding;
   wherein the first coil winding comprises broadband matching to the first preamplifier connected in a first frequency range at a Larmor frequency;
   wherein the first coil winding is arranged adjacent to the second coil winding, and the first coil winding and the second coil winding respectively form a first resonant circuit and a second resonant circuit, and a system comprising of the first coil winding and the second coil winding includes a first resonant frequency and a second resonant frequency, wherein the first resonant frequency and the second resonant frequency are different and lie in the first frequency range of the broadband matching.

2. The local coil matrix of claim 1, wherein the first coil winding includes a plurality of turns.

3. The local coil matrix of claim 1, wherein the first coil winding includes a direct signal connection without the matching network to the first preamplifier.

4. The local coil matrix of claim 1, wherein the local coil matrix comprises a matching network that includes a signal connection to the first coil winding and to the first preamplifier, wherein an impedance of the system comprising the matching network and the first coil winding is smaller than an input impedance of the first preamplifier.

5. The local coil matrix of claim 4, wherein the matching network is configured such that an increase in noise in a signal produced by a noise current of the first preamplifier across the impedance of the system comprising the matching network and the first coil winding in the event of detuning of the first coil winding, is smaller than a predetermined limit value.

6. The local coil matrix of claim 1, wherein the first preamplifier comprises an E-PHEMT transistor.

7. The local coil matrix of claim 1, wherein the matching network is further configured to change the first resonant frequency of the first coil winding, the broadband matching of the first preamplifier, or the first coil winding and the broadband matching of the first preamplifier.

8. The local coil matrix of claim 1, wherein the first coil winding and the second coil winding include a common coil-conductor segment and a decoupling element, wherein the matching network is further configured to favor in signals from the first coil winding and from the second coil winding, a resonant mode in which a current through the decoupling element is reduced.

9. The local coil matrix of claim 1, wherein the first coil winding comprises a first conducting segment and a second conducting segment that are electrically isolated from one another, wherein the first conducting segment and the second conducting segment include respective regions that overlap one another and are isolated from one another by a dielectric.

10. The local coil matrix of claim 1, wherein the local coil matrix comprises a signal line for connecting to a magnetic resonance tomography device, wherein the signal line comprises an ohmic sheath current filter.

11. The local coil matrix of claim 1, wherein the local coil matrix comprises a signal line for connecting to a magnetic resonance tomography device, wherein the signal line comprises a symmetrical twin-conductor lead.

12. The local coil matrix of claim 1, wherein the local coil matrix comprises a signal line for connecting to a magnetic resonance tomography device, wherein the signal line comprises a plug-in connector including a plurality of signal contacts, wherein a plurality of ground contacts surround each of the plurality of signal contacts.

13. The local coil matrix of claim 1, wherein the first coil winding comprises a superconductor.

14. The local coil matrix of claim 1, wherein the first coil winding comprises a dielectric including two opposite surfaces, on each of which is arranged in an opposing manner a conductor material of the first coil winding, wherein each conductor material on the two opposite surfaces is connected to the other in an electrically conductive manner by a via through the dielectric.

15. A magnetic resonance tomography device comprising:
   a local coil matrix comprising:
      a first coil winding;
      a second coil winding;
      a low-noise first preamplifier;
      a second preamplifier; and
   a controller configured to select a predetermined resonant mode from a plurality of resonant modes in order to switch a detection region of the local coil matrix between a mode that is sensitive at a surface and a mode that is sensitive at a specified depth and implement the predetermined resonant mode using signals from the first coil winding and from the second coil;
      wherein the first preamplifier is electrically connected to the first coil winding, the second preamplifier is electrically connected to the second coil winding;
      wherein the first coil winding comprises broadband matching to the first preamplifier connected in a first frequency range at a Larmor frequency;
      wherein the first coil winding is arranged adjacent to the second coil winding, and the first coil winding and the second coil winding respectively form a first resonant circuit and a second resonant circuit, and a system comprising of the first coil winding and the second coil winding includes a first resonant frequency and a second resonant frequency, wherein the first resonant frequency and the second resonant frequency are different and lie in the first frequency range of the broadband matching.

16. The magnetic resonance tomography device of claim 15, wherein the controller is further configured to implement a resonant mode in which a current through a decoupling element is reduced.

17. The magnetic resonance tomography device of claim 15, wherein the magnetic resonance tomography device further comprises a magnetic field camera including an yttrium iron garnet sample, the magnetic field camera configured to calibrate and homogenize magnetic fields of the local coil matrix.

\* \* \* \* \*